United States Patent
Hauf et al.

(10) Patent No.: US 7,412,299 B2
(45) Date of Patent: Aug. 12, 2008

(54) PROCESS FOR DETERMINING THE TEMPERATURE OF A SEMICONDUCTOR WAFER IN A RAPID HEATING UNIT

(75) Inventors: Markus Hauf, Ichenhausen (DE); Christoph Merkl, Staig (DE); Christoph Striebel, Dornstadt (DE)

(73) Assignee: Mattson Thermal Products GmbH, Dornstadt (DE)

( * ) Notice: Subject to any disclaimer, the term of this patent is extended or adjusted under 35 U.S.C. 154(b) by 394 days.

(21) Appl. No.: 10/540,613

(22) PCT Filed: Nov. 28, 2003

(86) PCT No.: PCT/EP03/13387

§ 371 (c)(1),
(2), (4) Date: Aug. 15, 2005

(87) PCT Pub. No.: WO2004/059271

PCT Pub. Date: Jul. 15, 2004

(65) Prior Publication Data

US 2006/0100735 A1 May 11, 2006

(30) Foreign Application Priority Data

Dec. 23, 2002 (DE) .................. 102 60 673
Jun. 27, 2003 (DE) .................. 103 29 107

(51) Int. Cl.
*G06F 19/00* (2006.01)
*G05B 13/02* (2006.01)
(52) U.S. Cl. ................ 700/121; 700/31; 700/207
(58) Field of Classification Search ............ 700/29–31, 700/121, 207, 299–300; 438/5, 7, 14, 16, 438/795

See application file for complete search history.

(56) References Cited

U.S. PATENT DOCUMENTS 5,442,727 A 8/1995 Fiory ..................... 392/416

(Continued)

FOREIGN PATENT DOCUMENTS

| DE | 198 52 321 | 6/1999 |
| DE | 101 56 441 | 11/2002 |
| WO | WO 00/34986 | 6/2000 |

OTHER PUBLICATIONS

DE 198 52 320, not published, Germany.

*Primary Examiner*—Ryan A Jarrett
(74) *Attorney, Agent, or Firm*—Dority & Manning, P.A.

(57) ABSTRACT

The invention relates to a process for determining at least one state variable from a model of an RTP system by means of at least one measurement signal measured on the RTP system—the measurement value—which has a dependency upon the state variable to be determined, and a measurement value forecast by means of the model—the forecast value—, whereby the measurement value and the forecast value respectively comprise components of a constant and a changeable portion, and whereby respectively at least the changeable portion is established, separated by a filter, so as to form a first difference between the changeable portion of the measurement value and the changeable portion of the measurement value forecast by the model, parameter adaptation of at least one model parameter by recirculation of the first difference in the model with the aim of adapting the model behavior to variable system parameters, forming of a second difference from the measurement value and the forecast value or from the measurement value adjusted by the changeable portion and the adjusted forecast value, state correction of a state of the model system by recirculation of the second difference in the model, with the aim of bringing the state of the model system into correspondence with that of the real system, and measurement of the at least one state variable on the model.

42 Claims, 8 Drawing Sheets

U.S. PATENT DOCUMENTS

| | | | |
|---|---|---|---|
| 5,583,780 A | 12/1996 | Kee et al. | 700/117 |
| 5,783,804 A * | 7/1998 | Burke et al. | 219/494 |
| 5,837,555 A | 11/1998 | Kaltenbrunner et al. | 438/796 |
| 5,872,889 A | 2/1999 | Kaltenbrunner et al. | 392/418 |
| 5,895,596 A | 4/1999 | Stoddard et al. | 219/497 |
| 6,051,512 A | 4/2000 | Sommer et al. | 438/795 |
| 6,056,434 A * | 5/2000 | Champetier | 374/126 |
| 6,169,271 B1 * | 1/2001 | Savas et al. | 219/390 |
| 6,191,392 B1 | 2/2001 | Hauf et al. | 219/411 |
| 6,310,328 B1 | 10/2001 | Gat | 219/411 |
| 6,369,363 B2 | 4/2002 | Hauf et al. | 219/411 |
| 6,373,033 B1 | 4/2002 | de Waard et al. | 219/497 |
| 2002/0107604 A1 | 8/2002 | Riley et al. | 700/121 |
| 2003/0166317 A1 * | 9/2003 | Blersch et al. | 438/200 |

* cited by examiner

PROCESS FOR DETERMINING THE TEMPERATURE OF A SEMICONDUCTOR WAFER IN A RAPID HEATING UNIT

This specification for the instant application should be granted the priority dates of Dec. 23, 2002, the filing date of the corresponding German patent application 102 60 673.0, Jun. 27, 2003, the filing date of the corresponding German patent application 103 29 107.5, as well as Nov. 28, 2003, the filing date of International patent application PCT/EP2003/013387.

BACKGROUND OF THE INVENTION

This invention relates to a process for determining at least one state or condition variable from a model of an RTP system by means of at least one measurement signal measured on the RTP system—the measurement value—which has a dependency upon the state variables to be determined. In particular, this invention relates to a process for determining the temperature of an object, preferably a substrate such as e.g. a semiconductor wafer in a rapid heating unit whereby the object or the substrate is heated by radiation sources.

Rapid heating units for the thermal treatment of substrates such as e.g. semiconductor wafers are widely known in the production of semiconductors. They are used for the thermal treatment of wafers which are preferably made from silicon but, however, can also be made from compound semiconductors such as e.g. II-VI, II-V and IV-IV semiconductors. An important feature with the thermal treatment of semiconductor wafers in a rapid heating unit is accurate control and regulation of the wafer temperature during the thermal treatment. This control and regulation of the wafer temperature requires, once again, accurate determination of the wafer temperature during the thermal treatment in order to control or regulate the rapid heating unit correspondingly. This invention relates especially to the aspect of determining the temperature of a semiconductor wafer during its thermal treatment in a rapid heating unit. In general, the invention relates to determining a state variable from a model of an RTP system which describes the state of the RTP system by means of model parameters.

Different processes for determining the temperature of a semiconductor wafer in a rapid heating unit are known. On the one hand it is known to attach thermal elements to the semiconductor wafers themselves and/or in the direct proximity of the same in order to establish their temperature. The problem arises here, however, that on the one hand, a complex process is required in order to attach the thermal elements to the semiconductor wafers, and on the other hand, they lead to local temperature inhomogeneities because they generally have to remain in thermally conductive contact with the semiconductor wafers, and moreover, effect the radiation field in the fast heating unit, at least near to the thermal element.

Another, contactless process which was made known, for example, in the patent applications and patents DE-A-19852320, U.S. Pat. No. 6,191,392 and U.S. Pat. No. 6,369,363 tracing back to the applicant, uses a contactless temperature measurement. With this contactless temperature measurement a first pyrometer is provided which is directed to one side of the wafer in order to collect radiation coming from the wafer which contains heat radiation from the wafer as well as radiation from the radiation sources reflected on the wafer. Furthermore, a second pyrometer is provided which is directed towards the radiation sources themselves in order to collect radiation coming from the radiation sources which is provided with a modulation. The modulation of the radiation sources is chosen here such that it does not effect the heat radiation of the wafer, but can be measured in the radiation from the radiation sources reflected on the wafer. Using a specific algorithm, it is possible to separate, to a certain extent, the heat radiation of the wafer measured on the first pyrometer from the radiation of the radiation source reflected on the wafer. The temperature of the wafer can then be determined from the heat radiation.

This type of temperature determination requires, however, two pyrometers or detectors, namely a so-called wafer pyrometer (or generally, a detector for measuring the radiation emitted from the wafer and reflected on the wafer or transmitted through the wafer) and a lamp pyrometer (or a second measurement system for collecting the radiation emitted from the lamps or the radiation sources), which are respectively associated with high costs. Furthermore, the lamp pyrometer or the second measuring system not only collects radiation originating from the radiation sources, but also partially radiation originating from the wafer, and this makes it difficult to accurately establish the temperature of the semiconductor wafer and requires additional means for accurately determining the lamp radiation, as described in the patent application DE-A-19852321 tracing back to the applicant. Additional problems arise with a high dynamic of the rapid heating system with regard to the temperature-time behavior of the wafer. If e.g. there are high heating rates of the wafer of over 250° C./sec., the radiation signals of the heat emitters and of the wafer contain frequency portions in the range of the modulation frequency. This results, among other things, in a falsification of the amplitude ratio established in the frequency range from the radiation emitted from the heat emitters and measured by the wafer pyrometer. The transient measurement errors caused by this can have an extremely adverse effect upon the stability and performance of the controlled system with a high dynamic. The contactless temperature determination with the help of modulated radiation sources described above is therefore suitable, preferably for quasi-stationary systems, i.e. for systems or temperature-time processes to which the rapid heating unit wafer system is subjected which are quasi-stationary, i.e. in comparison to the modulation frequency of the radiation sources, they only change slowly with regard to time. A further problem results from the sensor sensitivity and from the requirements with regard to measuring accuracy because the contributions of the modulated radiation are to be very accurately established, because by means of this, an in situ emissivity and/or transmissivity determination of the object (the wafer) takes place.

Starting from the above specified prior art, the task which forms the basis of this invention is to provide a process for determining the temperature of a semiconductor wafer in a rapid heating unit whereby the substrate is heated with a radiation source, which in a simple and cost-effective way makes it possible to reliably determine the temperature of the semiconductor wafer. Furthermore, the task which forms the basis of this invention is to determine a state variable of an RTP system, whereby especially, the state variable can be the temperature of a semiconductor wafer in the rapid heating unit.

SUMMARY OF THE INVENTION

In accordance with the invention, the process for determining the temperature of an object (preferably of a substrate such as e.g. a semiconductor wafer) in a rapid heating unit where the object (e.g. a semiconductor wafer) is heated with radiation sources (e.g. heat emitters), comprises the recording of an actuation value of the radiation sources, the recording of a measurement value, which is strongly dependent upon the state value of an object in the rapid heating unit to be determined, or has sufficient dependency upon the state value to be determined such as e.g. the temperature of the object (e.g. of the semiconductor wafer), determination of a forecast value for this measurement value of the at least one object by means of a system model of the rapid heating unit including a semiconductor wafer (object) which is acted upon by the actuation value of the radiation sources, determination of a state correction (in this application, also called the control value) for the system model from the difference between the measurement value recorded and the forecast or predicted value of the measurement value and determination of at least one state variable of a state of the semiconductor wafer and of a state of the system consisting of the semiconductor wafer and the rapid heating unit using the system model and the state correction, whereby the determination of the forecast value of the measurement value takes place at least partially using the determined state variables.

After applying the state correction, the model state corresponds very well to the system state. The model therefore represents the state of the real system, and this is why the system state to be determined, such as e.g. the wafer temperature, can be measured directly from the system model.

This process makes it possible, in a simple and cost-effective way, to determine at least one state variable of a state vector which preferably describes the state of the system consisting of the semiconductor wafer and the rapid heating unit, whereby the temporal development of the system state and the reaction of the same to the actuation value are described by a system model which preferably comprises several part models into which, on the one hand, at least one actuation value of the rapid heating unit such as e.g. an actuation value of the radiation sources, and on the other hand, at least one specific state correction, are entered. In general, rapid heating systems are systems whereby the different components with distributed system parameters and system states such as e.g. emissivity and temperature, have a complex thermal interaction relationship to one another. The full description of the real system would therefore involve a very large number of system parameters and an accurate knowledge of the details of all thermal interactions. For reasons relating to real time requirements, full model descriptions are therefore not generally feasible, and this is why the system models are preferably models reduced to the essential properties of the thermal system for the correct representation of the dynamic of the state variables of interest.

If one assumes that the initial state of the system model and of the real system is exactly the same, that the system model exactly illustrates the dynamic behavior of the real system, and that there are no interference values effecting the real system, the states of the system model and the real system would always develop in the same way with the same actuation value. These assumptions are not realistic, however, and so the system model is supplemented by a control. The output variables (measurement values) of the controlled path (real system) are compared with those of the system model (observer) and differences between them retroact by means of a controller on the state of the observer. By means of this state correction (the retroaction of the difference between forecast values and measured values upon the state and/or the parameters of the observer is also called the control value or control parameter in this application), the state of the observer is adapted to that of the real system, whereby the controller minimizes the difference between the respective output values. The smaller the differences, the better at least the observed state variables of the observer correspond to those of the controlled path (of the real system). If the temperature of a semiconductor wafer is this type of observable state variable, it can be taken directly from the system model or measured from the same.

Or expressed differently, if for the state correction, the difference between the predicted value and the measurement value or the retroaction of the difference upon the state or the parameters of the observer is identified as the control value or the control parameter for adaptation of the observer, i.e. the system model, the control value (or control parameter) is determined by means of an algorithm which compares a measurement value recorded for an object in the rapid heating unit with a forecast value of the measurement value of the object, and is intended to minimize the difference between these two values. The smaller the difference, the better the state variable, determined using the model, describes the actual state of the system consisting of a semiconductor wafer (object) and the rapid heating unit, and so also the state of the object (semiconductor wafer), by means of which, as well as other variables of this state, in particular the temperature of the object and of the semiconductor wafer can be determined.

In general, one can describe the dynamic behavior of a system by means of a state equation, whereby the state vector x is composed from one or more state variables. The state vector x(t) develops over time, whereby the temporal development is generally described by means of a system of differential equations. By means of appropriate transformation, the differential equations can be transferred to the general form of the state equation $x=f(x(t),u(t))$, whereby x is the temporal derivative, u(t) the input vector of a system, which in the case of a controlled system, amongst other things, is very time-dependent, and f is generally a vector value function. These types of state variables also describe the state or the states of a system model, e.g. of the system model consisting of the RTP system and the object (semiconductor wafer, substrate). Furthermore, systems or system models are characterized by parameters whereby the system parameters generally do not develop over time or no explicit temporal dependency can be given for the system parameters. However, the parameters determine the transfer behavior of the system or of the system model, i.e. the relationship between input and output values. Parameters are e.g. emissivity, transmissivity and reflectivity of the semiconductor wafer in the system model RTP system semiconductor wafer, whereas e.g. the wafer and radiation source temperature (lamp temperature) are state variables.

The state of the system consisting of the object and the rapid heating unit, and of the object is described as presented above, in general by means of a state vector which contains the state variable.

The process for determining a state variable from a model of an RTP system by means of at least one measurement signal measured on the RTP system—the measurement value—, which has a dependency upon the state variable to be determined, comprises, in accordance with the invention, a measurement value forecast by means of the model—the predicted value—, whereby the measurement value and the forecast value respectively comprise components of a constant and a changeable or alternating portion, and whereby respectively at least the changeable portion is determined separately by a filter, so as to form a first difference between the changeable portion of the measurement value and the changeable portion of the measurement value forecast by the model, a parameter adaptation of at least one model parameter by recirculating the first difference into the model with the aim of adapting the model behavior to variable system parameters, formation of a second difference from the measurement value and the forecast value or from the measurement value adjusted by the changeable portion and the adjusted or corrected forecast value, state correction of a state of the model system by recirculating the second difference into the model with the aim of bringing the state of the model system into correspondence with that of the real system, and measuring at least one state variable on the model.

Preferably, the state variable represents the temperature of the semiconductor wafer or another value from which the temperature of the semiconductor wafer can be clearly deduced.

The particular benefit of the above process in accordance with the invention is that only one sensor e.g. a pyrometer, is required for recording a measurement value, so as then to determine the state of the system consisting of the object (semiconductor wafer) and the rapid heating unit in such a way that e.g. the state of the object with regard to its temperature and/or any optical properties can be determined, which are a priori unknown system parameters, such as e.g., emissivity, transmissivity and/or reflectivity. Expressed in another way, the particular benefit of the process in accordance with the invention is that only one sensor e.g. a pyrometer, is required to record a measurement value, in order to determine a priori unknown system parameters such as emissivity, transmissivity and/or reflectivity of the semiconductor wafer, whereby the system model is brought, by means of parameter adaptation, to correspond as well as possible to the controlled path (the real system), and to make possible the state correction with which the states of observer and controlled path are brought to correspond to one another. By means of the model adjustment of the optical properties, the states of the system model and of the controlled path even remain consistent when the optical properties of the semiconductor wafer change (one talks of variable system parameters such as e.g. the reflectivity, transmissivity and emissivity of the semiconductor wafer, because these parameters are temperature dependent and so implicitly time dependent with the time dependent temperature of the semiconductor wafer), by means of which the temperature derived from a state variable also lies close to the real temperature in the controlled path. A determination of the lamp or radiation source intensity by means of an additional detector, as described for example in the previously specified DE-A-198 52 320, can then be dispensed with, and so the processes in accordance with the invention offer considerable simplification with regard to accuracy of measurement and of technical measuring complexity, and a considerable improvement to robustness, reliability and drift stability. Moreover, this invention allows almost interference free determination of temperature, even with a high system dynamic, i.e. with e.g. high heating and/or cooling rates of the wafer, and in particular with low wafer temperatures, and this is a prerequisite for reliable regulation of the rapid heating unit and so of the temperature of the semiconductor wafer, because any frequency components (Fourier components) which result from the system dynamic, are also included in the forecast values of the model of the process in accordance with the invention. This means that, even with a strong system dynamic, the forecast values and measurement values remain consistent, and consequently the additional frequency portions caused by the system dynamic must not be interpreted as interference. By means of this, these components can be separated from the actual modulation frequency of the radiation sources, such as e.g. the lamps, by means of which the susceptibility to interference and the efficiency of the rapid heating unit is considerably improved, in particular with high heating rates. Heating rates of up to 500° C. can now be used in the laboratory and partially in the domain of mass production in chip manufacture. The process in accordance with the invention therefore preferably makes use of a pyrometer (or radiation detector) for the measurement of the wafer radiation, because information such as e.g. the radiation source intensity (e.g. of the lamp radiation) is provided by the model. So that, however, e.g. the radiation source intensity can be taken from the model with sufficient accuracy, a sufficiently accurate modeling of the heat emitters is required. If it is not possible to provide sufficiently accurate modeling of the heat emitters, the radiation source intensity can be determined e.g. by means of an additional radiation detector, e.g. by means of a pyrometer which determines the radiation source intensity directly with sufficient accuracy, e.g. by means of the use of appropriate aperture means, as they are described e.g. in patent application DE 19852321 tracing back to the applicant. The radiation source intensity can, however, also e.g. be established by means of a measurement of a value related to the intensity of the radiation source, whereby the radiation source intensity can then be produced by means of suitable conversion data. Instead of the conversion data, the radiation source intensity can also be obtained with the help of an observer or of an adaptive observer which comprises a radiation source model. Here, the value measured serves as a state correction of the radiation source state and/or as parameter adaptation of parameters of the radiation source model. FIG. 8 schematically shows the relationship between an input value u(t) and a measured value y(t) for determining the radiation source intensity. An input signal u(t) is given on a controller 200 which controls the radiation sources 220 e.g. lamps corresponding to the input signal. Between the controller and the radiation sources is located a driver 210 which provides the corresponding input value u(t) for the corresponding power for operating the radiation sources. The radiation sources, e.g. halogen lamps, then radiate the intensity $I_{BB}$ in broadband, whereby a part of the radiation reaches the wafer 230. The wafer is heated by this and then, by means of the wafer pyrometer, e.g. a narrow band signal $1_{NB}$ is established which serves to establish the wafer temperature. If the radiation source intensity is not determined by means of a sufficiently accurate modeling of the heat emitters with the exclusive use of the input signal u(t), as mentioned above, additional measured values y(t) such as e.g. lamp voltage V and/or lamp current I and/or lamp radiation intensity (broadband $1_{BB}$ and/or narrowband $1_{NB}$) can serve to determine the radiation source intensity, whereby, as mentioned, these measured values y(t) can also be used to adjust a radiation source model from which the radiation source intensity is then obtained.

With the process for determining a state variable, the recirculation of the first difference preferably takes place using a first valuation function and a first control algorithm and/or the recirculation of the second difference using a second valuation function and a second control algorithm. The valuation functions here reproduce a gauge for the correspondence of the measured and forecast signal. The control algorithm then determines how the respective difference effects the model, taking into account the valuation function, i.e. how the states and/or parameters of the model are changed so as to reach the state correction and/or parameter adaptation so that the forecast value and measured value correspond to one another as closely as possible. In order to be able to compensate low frequency deviations more effectively, it is often beneficial to also use integrators in the recirculation branches as well as proportional corrections by means of recirculation matrices. The determination of a difference and the recirculation of the same into the system model for state correction or for parameter adaptation is generally also called the determination of a control value within this application, with which the model states or model parameters can be influenced. In this connection therefore, the term control value is extended in comparison to the term "control value" ordinarily used in control technology which means a system output value controlled by means of a controller.

In another preferred embodiment of the process for determining a state variable from a model of an RTP system by means of at least one measurement signal measured on the RTP system, the RTP system is a rapid heating unit with which an object, preferably a semiconductor wafer, is heated with radiation sources (heat emitters such as e.g. halogen lamps), and/or the model comprises at least one object heated in the RTP system, for example at least one semiconductor wafer, and forms a system model. This type of RTP system is generally called a "cold wall reactor" because the heating of the wafer (object) takes please substantially by means of radiation energy from the heat emitters, and the wall of the RTP system is cold in the sense that the temperature of the wall is substantially lower than the temperature of the wafer.

In general, however, the RTP system can also be a hot wall reactor whereby the wall of the RTP system or the process chamber, in which the object (e.g. the wafer) to be processed, is located, is generally at a higher temperature than the object to be heated.

Preferably, the RTP system comprises different heat emitters which are respectively actuated by means of an actuation value, whereby the heat emitters (or in general, the radiation sources) are preferably actuated to modulate the radiated radiation intensity by means of the actuation value with different modulation parameters in order to clearly adapt several model parameters of the system model, such as for example the transmissivity or reflectivity of a wafer. Because preferably, the system model, by means of the model parameters, takes into account the optical properties of the wafer, whereby the optical properties of the wafer in the system model are then adjusted to the real optical properties of the wafer in the rapid heating unit. The heat emitters can be combined into groups here, whereby the respective groups are then actuated respectively with an actuation value.

The modulation of the radiation sources (e.g. heat emitters) can also be achieved or demonstrated by means of a continuous, not necessarily periodic stimulus, e.g. these generated stimuli can be caused by pseudo random sequences (random stimuli) or colored noise, whereby these sequences or the noise can be fed specifically to the set value of the heat emitters (or in general, to the radiation source or the radiation sources). The non-periodic stimuli can, however, also occur due to parasitic stimuli occurring in the system (therefore e.g. caused by interference) which effect the set value of the heat emitters. Reasonable parameter adaptation is also possible by means of this invention in these cases.

In accordance with a particularly preferred embodiment of the invention, the measurement value comprises at least one heat radiation coming from the semiconductor wafer which is collected by a radiation detector, preferably a pyrometer. However, the heat radiation can also be established in other ways such as e.g. by means of a thermal element a defined distance away from the wafer and which measures a change in temperature caused by the heat radiation e.g. of a blackened surface. A pyrometer makes possible accurate determination of the radiation intensity and works contact free. The radiation signal collected here by the pyrometer comprises at least one portion of the heat radiation of the wafer emitted from a measurement area on the semiconductor and radiation from the radiation sources reflected on the wafer and radiation transmitted independently of the wafer material and the wafer temperature through the wafer. Preferably, the radiation of the radiation sources has a modulation which allows a difference from the direct heat radiation of the wafer. With this, it is possible to identify the radiation reflected on the wafer and/or the radiation transmitted through the wafer by means of modulation parameters of the radiation source modulation, as described in greater detail e.g. in patents U.S. Pat. No. 6,191,392 and U.S. Pat. No. 6,369,363 tracing back to the applicant, whereby in this process, as already mentioned, a technical measurement recording of the radiation source intensity can be dispensed with. When using modulated radiation sources (heat emitters), the measurement value comprises a changeable portion substantially dependent upon the optical properties of the wafer, which is produced by the modulation of the radiation sources, with which an adjustment of the optical properties (preferably emissivity and/or transmissivity and/or reflectivity) can then be made using an algorithm which adjusts the changeable portion in the measurement value recorded and in the measurement value forecast by the system model by means of adaptation of the optical properties of the wafer (object) in the system model.

Alternatively or in addition to the above embodiment, the measurement value comprises radiation coming from an item e.g. contact free, by means of a pyrometer and/or the measurement value records the temperature or a measurement value relating to the temperature of the item by means of direct contact e.g. by means of a thermal element. Here, the item relates to the object, the semiconductor wafer, in such a way that a temperature change of the object (semiconductor wafer) brings about the temperature change or a change to the measurement value of the item in such a way, that e.g. by means of a model and/or a function from the knowledge of the state (e.g. temperature or of a measurement value relating to the temperature or of the measurement value) of the item, the temperature and/or the state of the object (wafer) can be concluded. The item can be e.g. a second wafer or a "cover plate", whereby this is fixed over and/or below the actual wafer, a small distance away from the wafer, as illustrated in U.S. Pat. No. 6,051,512 or in U.S. Pat. No. 6,310,328 tracing back to the applicant. Moreover, the item can be e.g. an area of the process chamber, a surface located near to a side of the object or wafer which reflects at least part of the wafer radiation, an area of a quartz disc (e.g. which is part of a quartz process chamber) which is positioned close to the object, or an object additionally introduced into the process chamber which reacts sensitively to any temperature changes and/or to the temperature of the wafer (object) with regard to its measurement value. Preferably, in this embodiment as well, the RTP system comprises at least one heating device which is modulated with regard to the heat energy it gives out, and whereby the measurement value on an object is established which, due to its thermal properties (such as e.g. thermal mass) and/or its thermal coupling onto the modulated heating device (e.g. radiation source) only unsubstantially follows, with regard to its temperature, the modulation of the heating device, i.e. e.g. that a relative parameter (such as e.g. a modulation amplitude divided by the amplitude of the whole signal) for the temperature modulation on the object is less than approximately 25%, preferably less than 10% or even less than 1% of the same relative parameter for the modulation of the heating device. Preferably, the object comprises or is a semiconductor wafer, a cladding (e.g. a graphite box, as made known in U.S. Pat. No. 5,837,555, U.S. Pat. No. 5,872,889 tracing back to the applicant, and patent application DE 101 56441 or a box as described in PCT/IB99/01946) which at least partially surrounds at least one semiconductor wafer), a chamber wall (or part of a chamber wall) of a process chamber of the RTP system, or generally an item close to the semiconductor wafer. Preferably, the measurement value is recorded by means of a pyrometer and/or thermal element, and the state variable established for the state is the temperature of the object and/or the temperature of the semiconductor wafer, whereby preferably, the measurement value is established on the semiconductor wafer and/or on an item near to the semiconductor wafer. Preferably also are the optical properties of the object such as e.g. the reflectivity, the transmissivity and/or the emissivity in the model are considered as model parameters.

With a preferred embodiment of the invention given as an example, the determination of the forecast value of the measurement value comprises the determination of a forecast value of the wafer radiation which forecasts a portion caused by the wafer radiation on the pyrometer signal, i.e. the portion of the wafer radiation in the area of the measurement point on the wafer which contributes to the measurement signal of the radiation measuring unit. Because the signal recorded comprises a radiation portion from the wafer as well as radiation portions from the radiation sources, i.e. the heat emitters, it is beneficial for a clear state correction to separate the wafer and heat emitter portion. The state reconstruction or, in other words, the correct interpretation, is based here upon model forecasts from both radiation portions. Here, the forecast of the signal portion of the wafer preferably comprises the determination of an intensity value of the heat radiation from the wafer in the area of a measurement wave length of the pyrometer using the established state variables and an established emissivity of the wafer. Preferably, the forecast value of the wafer radiation is then determined using a model, taking into consideration the previously established intensity value of the wafer radiation in the area of the measurement wave length of the pyrometer and of an established emissivity of the wafer. In this way, the portion on the pyrometer signal caused by the wafer is more beneficially forecast. Here, the model takes into consideration an influence of the chamber upon the effective emissivity of the wafer, because the chamber geometry and the reflectivity of the chamber walls can apparently have an effect which increases emissivity.

With a preferred embodiment of the invention given as an example, the determination of the forecast value of the measurement value further comprises, as well as determination of the wafer forecast value, the determination of a lamp forecast value (radiation source forecast value) and in general of a forecast value of the radiation from the radiation sources collected on the radiation measurement unit, which preferably are lamps, e.g. halogen lamps of any form, flash lamps and/or arc lamps of any form or laser light sources. In general, radiation sources can also be hot surfaces such as e.g. heated plates. The lamp forecast value and radiation source forecast value forecasts a portion caused by the radiation sources on the pyrometer signal or detector signal. In this way, a portion of the radiation coming from the radiation sources on the pyrometer signal, caused in particular by reflection and/or transmission on the wafer, can be forecast, whereby parameters of the reflectivity/transmissivity of the wafer adapted to this are used. Here, the determination of the lamp (radiation source) forecast value arising from the interaction between the wafer and the radiation sources (lamps) preferably comprises the determination of a broadband intensity value of the heat radiation of the wafer using the established state variable (e.g. the wafer temperature), taking into account an emissivity of the wafer. In order to improve the accuracy of the model forecast, the radiation interactions or other heat coupling mechanisms, such as e.g. heat convection and/or heat conduction between different objects (e.g. lamps, wafer, quartz elements within the process chamber or the process chamber or parts thereof) can generally be taken into consideration. Preferably the determination of the lamp forecast value further comprises the determination of an intensity value for the radiation sources using a lamp model or a radiation source model and the actuation value of the radiation sources. Because the states of the heat emitters do not depend solely upon the set value of the same, but also are generally coupled together by means of broadband radiation interactions, it is beneficial also to take into account interactions of different heat emitters so as to improve the accuracy of the forecast of the states of the heat emitters. Here, the lamp and the radiation source model preferably takes into account interactions between the individual radiation sources themselves and/or with the wafer, whereby the broadband intensity value of the heat radiation of the wafer is input into the input value of the lamp radiation source model. Furthermore, the lamp model preferably takes into account interactions between the individual radiation sources such as e.g. between the lamps of a bank of lamps consisting of several lamps. The semiconductor wafer, as well as the different radiation sources among themselves, interact with the respective intensity value of a radiation source. Here, the interactions act, always temporally delayed, upon the intensity value of a radiation source. As well as the power figure defined by the set value, the radiation interactions also cause an additional power figure which, like the set value, determines the development over time of the emitter state. By taking into account these interactions e.g. in the lamp or radiation source model, particularly accurate intensity values can be forecast for the individual radiation sources.

Because with this process, specific temperature values of the semiconductor wafer should be used for controlling the temperature, all calculations should be made in real time, preferably with fixed intervals of time. In order to fulfill the real time requirements, it is therefore advantageous to minimize the required computing power. In order to simplify the model for the lamps and radiation sources, and to reduce the required computing power, the radiation sources are therefore preferably combined as groups, and the determination of the intensity value takes place for the respective groups. Here, the intensity value is determined for the respective groups using at least one, preferably however at least two representatives of the group in order to achieve a higher level of accuracy. Here, the radiation sources are preferably actuated at least within one group with the same actuation value.

When determining the lamp (heat emitter) forecast value, preferably a model is used which forecasts the portion of the lamp radiation which is reflected on the wafer and if required is transmitted through the wafer, which falls in the visual field of the pyrometer, and this is using the determined intensity value of the radiation sources and an established emissivity of the wafer. Here, the model preferably establishes the reflectivity, and if required, the transmissivity of the wafer using the established emissivity in order to determine the reflected and transmitted portion of the lamp radiation. Furthermore, the model preferably takes into account the chamber geometry in order also to take into account multiple reflections.

Preferably, the forecast value of the measurement value is formed by adding the wafer forecast value and the lamp (radiation source) forecast value, which should together forecast the measurement signal of the pyrometer. Here, the forecast value of the wafer radiation substantially contains a constant portion of the forecast value of the measurement value and the lamp forecast value substantially contains a constant portion and a changeable portion of the forecast value of the measurement value. The changeable portion of the forecast value of the measurement value substantially results from the modulation of the radiation of the radiation sources and the portion of the radiation reflected on the wafer and originating from the radiation sources, which should make it possible to distinguish between the two signals.

Preferably, for establishing the emissivity of the wafer, the forecast value of the measurement value is at least partially used. Here, the forecast value of the measurement value is preferably filtered so as to establish the changeable portion of the same which substantially corresponds to the modeled portion of the radiation originating from the radiation sources and reflected on the wafer. In order to establish the emissivity of the wafer, an adaptive algorithm is preferably used which adjusts the changeable portion (e.g. >1 Hz) of the forecast value of the measurement value and adjusts a changeable portion of the radiation coming from the semiconductor (which derives from at least one measurement point on the semiconductor wafer) recorded by the pyrometer. Because this adaptation algorithm only compares the changeable portions, the adaptation succeeds independently of the state of the real system and the system model. The adaptation algorithm and the state correction do not therefore effect one another.

For a homogenization of the wafer temperature in the rapid heating unit, this is preferably set in rotation relative to the lamps and radiation sources, whereby the rotation (turning) can produce a changeable portion of the radiation coming from the semiconductor wafer, for example by means of inhomogeneities on the wafer (object or substrate) surface, or inhomogeneities (optical fluctuations i.e. inhomogeneities with regard to transmission and/or reflection) on a co-rotating wafer support device (wafer carrier which holds the wafer and, if required, sets it in rotation. This changeable portion is taken into account for establishing a good emissivity value, i.e. for adapting the parameters of the model and/or in the model for establishing a state variable of the wafer and/or of the rapid heating unit (e.g. when determining state variables such as e.g. the rotation speed and/or the rotation phase). Preferably, as described above, the emissivity established is then scaled before it is introduced to other processes in order to provide compatibility with regard to the values used.

With a preferred embodiment of the invention, the semiconductor wafer in the model for establishing the state variable is seen as a so-called black body so that it is not necessary to establish emissivity for establishing the state variable, and the model only requires the actuation value of the radiation sources and the determined state correction in order to establish the state variable.

The models used with this invention can be based upon physical models, i.e. the models describe the actual fundamental physical effects as accurately as possible, or they can be empirical, i.e. e.g. described by means of a system transfer function. A description of the models by means of neural networks can also be beneficial. Moreover, several part models are preferably used which only in their entirety and by means of their reciprocal interaction form a total model of the object (substrate) of the system and rapid heating unit.

BRIEF DESCRIPTION OF THE DRAWINGS

This invention is described in greater detail in the following using a preferred embodiment, given as an example, and with reference to the drawings.

In the drawings.

DESCRIPTION OF SPECIFIC EMBODIMENTS

Figure 1:
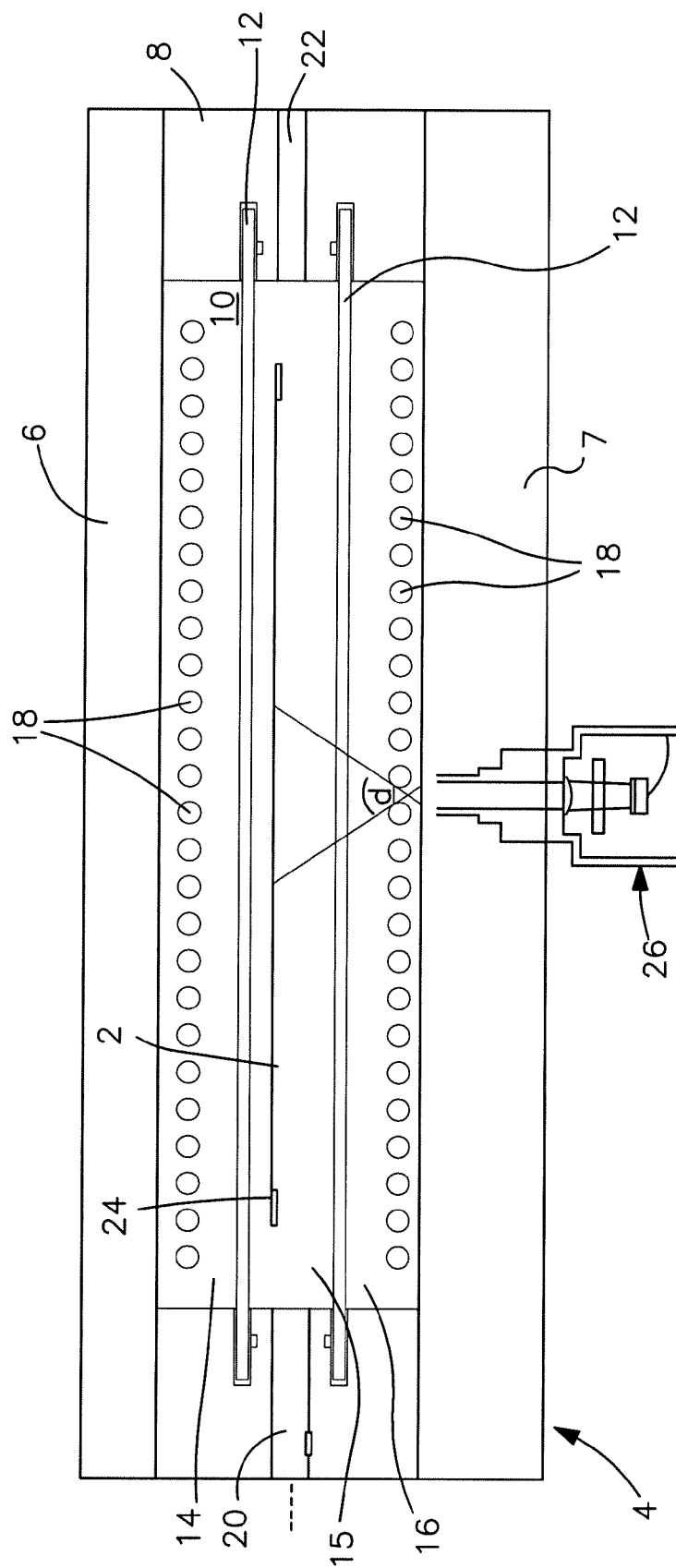
FIG. 1 shows a schematic representation of a rapid heating unit with which the process in accordance with the invention can be used.

FIG. 1 shows a schematic representation of a rapid heating unit 1 for the thermal treatment of a semiconductor wafer 2.

The rapid heating unit 1 has a housing 4 which consists of an upper wall 6, a lower wall 7 and a side wall 8 located between these. The walls 6, 7 and 8 together form a chamber 10. The chamber is divided by two quartz plates 12 into an upper chamber section 14, a middle chamber section 15, and a lower chamber section 16. In the upper and lower chamber sections 14, 16, a number of radiation sources 18 are respectively provided in the form of halogen lamps. Alternatively, or in addition, other radiation sources, such as for example arc lamps, flash lamps or lasers can be provided, whereby the radiation sources have a high dynamic so as to make it possible to heat the wafer 2 quickly. The quartz plates 12 are substantially permeable for the radiation from the radiation sources 18.

The middle chamber section 15 forms a process chamber 15 in which the wafer 2 is held by means of a suitable holding device, not shown in detail. The holding device can comprise a rotation device for rotating the wafer 2, and which is able to rotate the semiconductor wafer 2 within the process chamber, i.e. rotate the wafer relative to the radiation sources. In the process chamber section, the side wall 8 has an insertion/removal opening 20 for loading and unloading the semiconductor wafer 2. The insertion/removal opening 20 can be closed using a suitable mechanism, not shown in detail. Preferably, but not necessarily, there is a gas inlet opening 22 in the side wall 8 opposite the insertion/removal opening 20 for introducing a gas into the middle chamber section 15, i.e. the process chamber section.

Within the process chamber 15, a compensation ring 24 is preferably also provided which is able to compensate any marginal effects with regard to temperature distribution over the wafer during the thermal treatment.

Preferably, an opening for introducing a radiation measurement device 26, in particular a pyrometer, is provided in the lower housing wall 7. The pyrometer 26 has a visual field directed at the wafer 2, and this is represented by a broken line in FIG. 1. The visual field is arranged in such a way and has an opening angle such that radiation originating directly from the radiation sources does not fall in the visual field of the pyrometer 26, or radiation of this type is only recorded by the pyrometer to a very reduced extent. However, radiation from the radiation sources reflected on the wafer 2 can fall in the visual field of the pyrometer, as shown schematically in FIG. 2 by means of the beam C.

Figure 2:
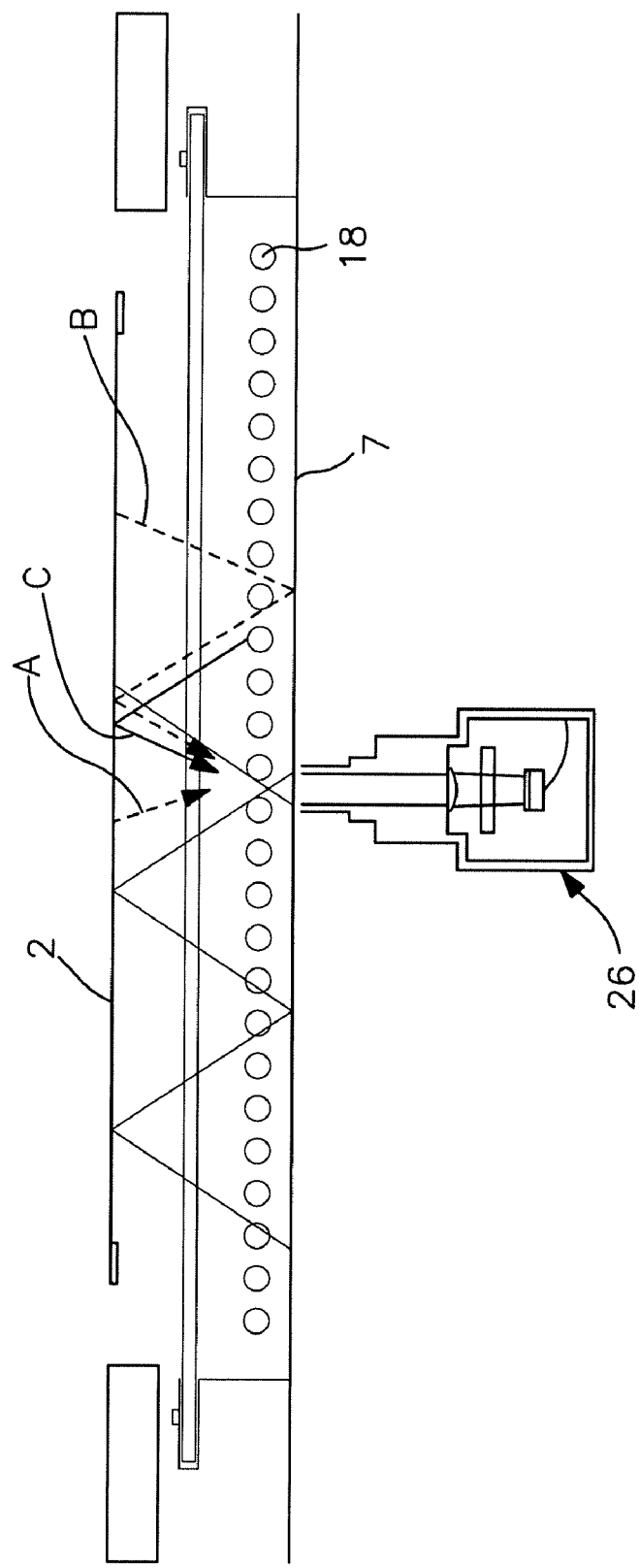
FIG. 2 shows a schematic representation of a part of the rapid heating unit in accordance with FIG. 1 in which the angle of incidence or opening angle of a radiation sensor and the influence of different elements in the rapid heating unit upon the signal measured from the radiation sensor are shown.

FIG. 2 schematically shows a part of the rapid heating unit 1, and in particular different radiation components which fall in the visual field (alpha) of the pyrometer 26. First of all, heat radiation coming directly from the wafer 2 falls in the visual field of the pyrometer, in so far as it originates from a point in the direct visual field of the pyrometer 26, as shown by the arrow A in FIG. 2. Furthermore, heat radiation from the wafer 2 falls in the visual field of the pyrometer 26, and this is reflected on the lower chamber wall 7 and on the wafer 2 itself, as shown by the dashed arrow B.

Moreover, radiation originating from the radiation sources 18 also falls in the visual field of the pyrometer, whereby it is reflected on the wafer 2, as shown by the arrow C. Of course, different reflection patterns to those shown are possible, so that different radiation portions, both from the wafer and also from the radiation sources, fall in the visual field of the pyrometer. With an illustration in FIG. 2, it is assumed that the wafer 2 for the radiation of the radiation sources 18 is substantially non-transparent. If this is not the case, radiation originating from the upper radiation sources 18 can also fall through the wafer 2 into the visual field of the pyrometer.

In order to make it possible to distinguish between the heat radiation from the wafer 2 and the radiation from the radiation sources 18 reflected on the wafer 2, the radiation from the radiation sources 18 has a modulation. Here, the modulation is chosen in such a way that the heat radiation of the wafer 2 does not follow this modulation. In order to distinguish between radiation reflected on the wafer and transmitted through the wafer, radiation sources located above and below the wafer can have different modulation types such as modulation frequency and/or modulation phase.

Figure 3:
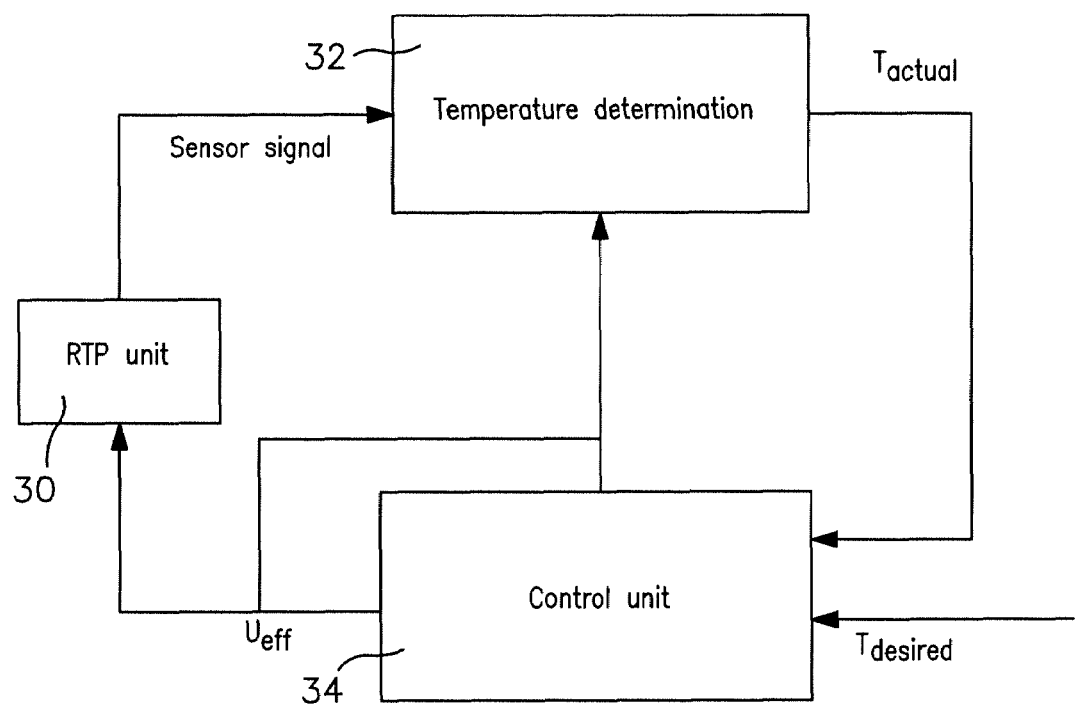
FIG. 3 shows a schematic representation of a temperature control in an RTP unit.

FIG. 3 shows a schematic representation of a temperature control of a rapid heating unit which uses temperature determination in accordance with this invention.

In FIG. 3, the rapid heating unit, which is also called an RTP unit (Rapid Thermal Processing unit), is shown by the block 30. A sensor signal goes from the block 30 to a block 32 in which a temperature determination takes place in accordance with this invention. The sensor signal is preferably the signal from the pyrometer 26 which contains a changeable portion as well as a constant portion. With an opaque wafer, the changeable portion substantially originates exclusively from the lamp radiation reflected on the wafer, whereas the constant portion originates from the heat radiation from the wafer as well as from the lamp radiation reflected on the wafer. With silicon wafers, an opaque wafer is at temperatures of approximately over 600° C. so that any radiation transmitted through the wafer, e.g. from a radiation source above the wafer, is no longer relevant.

In block 32 the temperature of the wafer is determined by means of the process described in greater detail in the following. The established temperature, which should represent the actual temperature of the wafer ($T_{actual}$) as well as possible, is forwarded to a control unit in block 34. The control unit in the block 34 compares the actual temperature ($T_{actual}$) with an incoming desired temperature value ($T_{desired}$) and, using the comparison, controls the actuation power of the lamps in the rapid heating unit 30. For this, e.g. an effective voltage ($U_{eff}$) is applied to the individual lamps. The control unit in the block 34 can have any controller, such as for example a PID controller or a model-based controller which contains a forward control. In any case, the value of the actuation signal $U_{eff}$ of the control unit in block 34 is also forwarded to block 32 so as to be used for the temperature determination. The temperature determination in block 32 is described in greater detail below, with reference to FIGS. 4 to 7.

Figure 4:
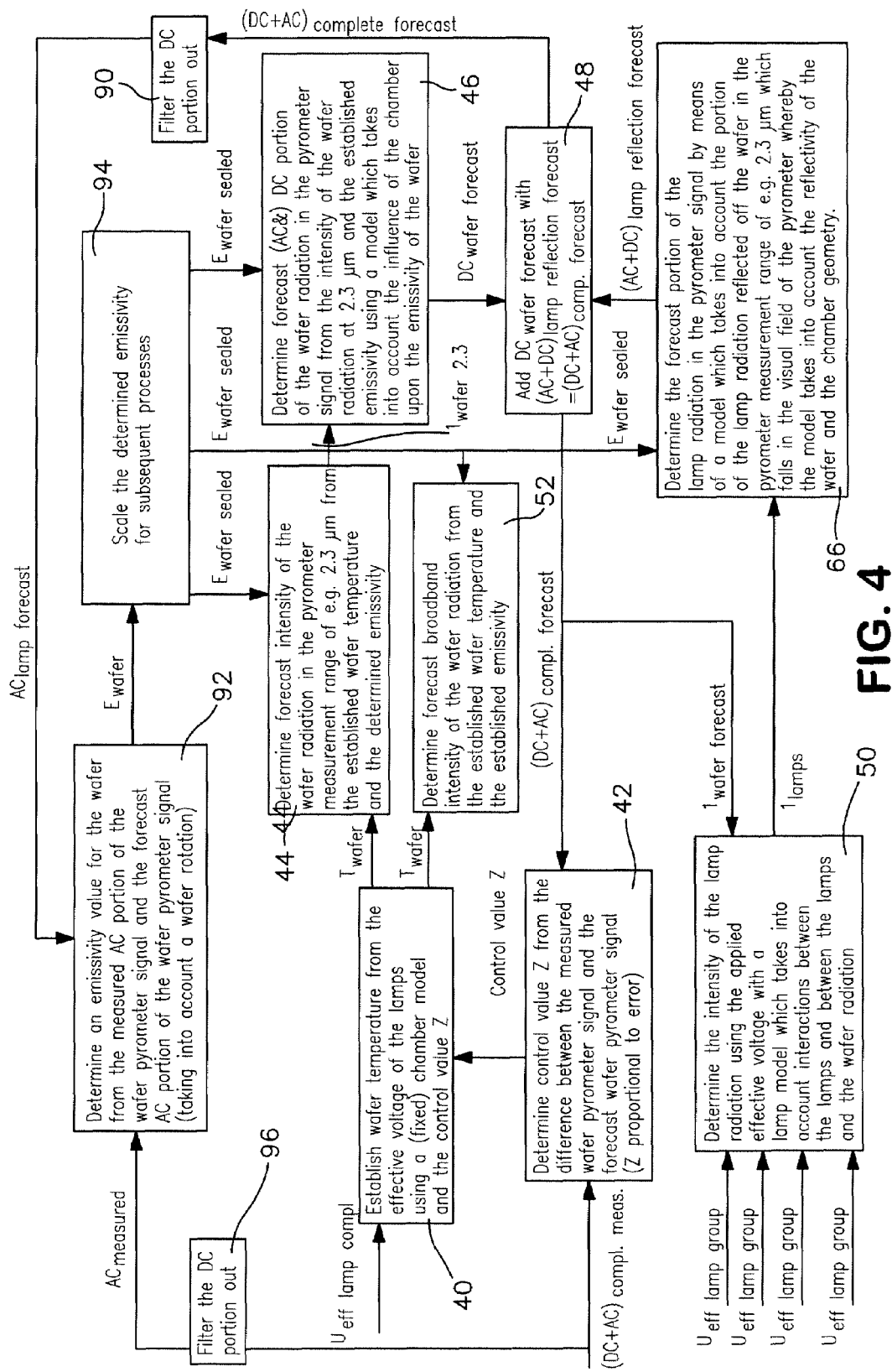
FIG. 4 shows a block diagram which shows a sequence of operation diagram for determining a wafer temperature in a rapid heating unit.

FIG. 4 shows, in block diagram form, the currently preferred embodiment of a process for establishing temperature.

The temperature is actually established in block 40. In block 40, the wafer temperature is established using a static chamber model which includes a model of the chamber, which includes at least a model of the chamber properties, preferably a model of the objects located in the chamber, preferably e.g. a wafer model, and optionally a lamp and radiation source model. In order to simplify the respective models, idealized parameters for the individual model are preferably used, at least in part. The wafer in the wafer model is thus seen, for example, as a black emitter or a so-called black body with an emissivity of one. The effective voltage ($U_{eff}$ lamps complete) which is applied to all of the lamps serves as an input value for establishing the wafer temperature, and this is for example fed from the control unit 34 in accordance with FIG. 3 in block 40. The established wafer temperature is also adapted using a state correction (control value) Z. This state correction can be understood to be a type of control circuit because from measured values, and from those forecast by the model (the observer), analogous to a desired/actual value comparison, a difference or a correction value is established, whereby the set value of a controller corresponds to the state correction. Alternatively or in addition to the effective voltage applied to the lamps and radiation sources, any radiation source parameter can be used which is suitable for making predictions about the energy radiated from the radiation source. In this way e.g. the current or directly measured radiation values by means of which the radiation of the radiation sources can be established, can also be chosen.

The state correction (control value) Z is once again determined in block 42, and it is proportional to a difference between a measured wafer pyrometer signal $(DC+AC)_{compl.\ measured}$ and a forecast wafer pyrometer signal $(DC+AC)_{compl.\ forecast}$. Block 42 can be in the form of a so-called P controller, whereby the correction would then be proportional to the error. In order to compensate low-frequency residual errors, at least one I-controller is, however, generally added. Of course, the controller can also be in the form of a PID controller. The measured wafer pyrometer signal corresponds to the sensor signal supplied from block 30 to block 32 in accordance with FIG. 3. This wafer pyrometer signal includes a constant portion and a changeable portion. The constant portion is substantially formed by radiation reflected on the wafer, as shown by the arrow C in FIG. 2. In addition, the constant portion includes wafer radiation, i.e. heat radiation from the wafer and a constant portion of the lamp radiation reflected on the wafer and/or on the chamber walls of the process chamber and/or of the housing.

The forecast wafer pyrometer signal is a signal which is formed from a forecast value of the wafer radiation $DC_{wafer\ forecast}$ and a lamp forecast value $(AC+DC)_{lamp\ refl.\ forecast}$. Here, the forecast value of the wafer radiation substantially only includes a constant portion, whereas the lamp forecast value includes a constant and changeable portion.

The forecast value of the wafer radiation is determined from the wafer temperature $T_{wafer}$ established in block 40. The established wafer temperature is first of all forwarded to a block 44. In block 44, a forecast intensity of the wafer radiation in the pyrometer measurement area is determined, for example at 2.3 μm. The determination takes place using the wafer temperature $T_{wafer}$ and an established emissivity $E_{wafer\ scaled}$ of the wafer. Establishing emissivity is described in greater detail below.

The forecast intensity of the wafer radiation $I_{wafer\ 2.3}$ is then forwarded to block 46. In block 46, the portion of the wafer radiation in the pyrometer signal is forecast, whereby the portion is substantially a constant portion, but can also include a changeable portion if required. The forecast is made using a model into which the intensity of the wafer radiation in the pyrometer measurement area ($I_{wafer\ 2.3}$) and the established emissivity $E_{wafer\ scaled}$ are entered as variable values. Here, the model also includes a model which takes into account the influence of the chamber upon the apparent emissivity of the wafer, i.e. an apparent increase in emissivity by means of the reflection properties of the process chamber and the chamber walls. The forecast portion of the wafer radiation in the pyrometer signal $DC_{wafer\ forecast}$ represents the forecast value of the wafer radiation and is forwarded to an adding device in block 48 where it is added to the lamp forecast value so as to obtain the forecast wafer pyrometer signal $(DC+AC)_{complete\ forecast}$.

The lamp forecast value is established separately from the forecast value of the wafer radiation. Here, the intensity of the lamp radiation is first of all established using the effective voltage applied to the lamps or another suitable radiation source parameter with a lamp (radiation source) model, and this happens in block 50. The effective voltage applied to the lamps is supplied, for example, from the control unit in block 34 in accordance with FIG. 3 to block 50. In order to simplify the lamp model, the intensity is not determined for every individual lamp, of which, for example, over fifty can be provided in the fast heating unit. Rather, the lamps are preferably divided into different groups, for example four groups, whereby the lamps of each group are substantially actuated respectively with the same lamp voltage. With the preferred embodiment given as an example, the intensity value is determined for the respective groups using at least two representatives from the group.

The lamp model is built in such a way that it takes into account interactions between the respective lamp filaments. Furthermore, the lamp model takes into account interactions between the respective lamps and the wafer radiation. For this reason, when determining the intensity of the lamp radiation a forecast broadband intensity $I_{wafer\ forecast}$ of the wafer radiation is entered into the lamp model as well as the effective voltage applied to the lamps. The forecast broadband intensity of the wafer radiation is determined in block 52 using the wafer temperature $T_{wafer}$ established in block 40 and, if so required, the established emissivity.

Figure 7:
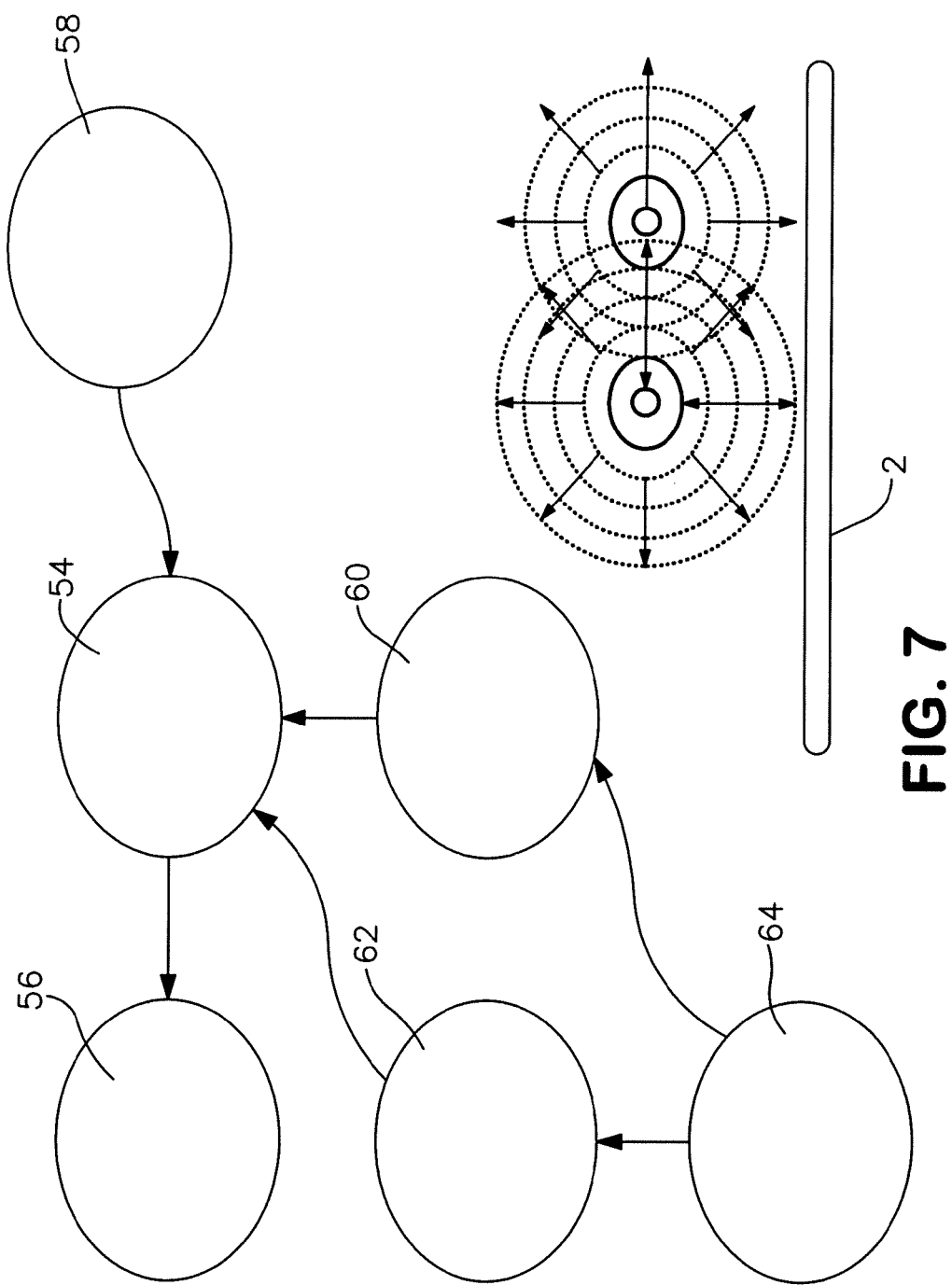
FIG. 7 shows a schematic representation of function blocks of a lamp model which is used for establishing the wafer temperature in a rapid heating unit and FIG. 8 shows a schematic representation of the relationship between an input value u(t) and a measurement value y(t).
Figure 8:
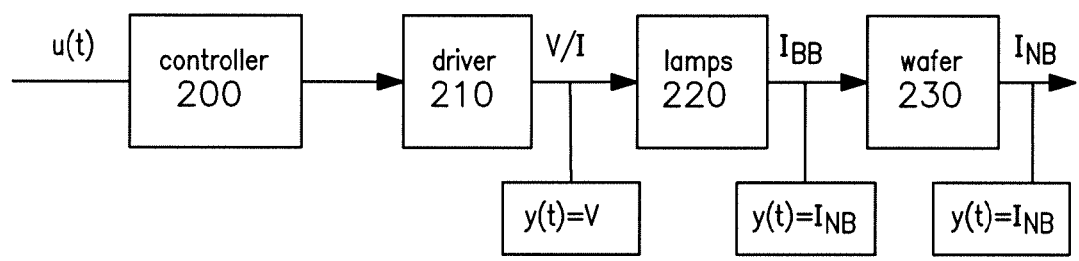

The components which go into the lamp model are shown again, for clarification, in FIG. 7. Here, the circle 54 forms the actual lamp model. The lamp radiation is derived from the lamp model, as shown by the circle 56.

An idealized lamp model goes into the lamp model 54, and this models the intensity of the lamp radiation in an open, endless space. However, a correction parameter is also entered into lamp model 54 from the block 60, and this takes into account the interactions between the individual lamp filaments of the lamps, in particular between adjacent lamps. These interactions are schematically shown in the diagram shown in the lower right hand corner of FIG. 7.

A second correction parameter from the circle 62 is also entered into the lamp model 54, and this takes into account interactions between the lamp filament and the wafer 2. These interactions are also shown in the schematic representation.

The respective interactions between the lamp filaments themselves and between the lamp filaments and the wafer are established in advance using a reference sensor, as shown by circle 64. Instead of a measurement taken by means of a reference sensor, it is also possible, of course, to provide a corresponding mathematical model for the respective interactions.

Reference is now made to FIG. 4 again, and the determination of the lamp forecast value is explained in further detail. The intensity of the lamp radiation $I_{lamps}$ determined in block 50 is now forwarded to block 66. In block 66 the forecast portion of the lamp radiation in the pyrometer signal is determined. It is determined by means of a model which uses the intensity of the lamp radiation $I_{lamps}$ and the emissivity $E_{wafer\ scaled}$ determined for the wafer as input values. The model contains a weighting for the portion of the individual lamps because the different lamps have a different influence upon the pyrometer signal. The model takes into account the portion of the lamp radiation in the pyrometer measurement area reflected on the wafer which falls in the visual field of the pyrometer, whereby the model takes into account the reflectivity of the wafer and the chamber geometry. The reflectivity of the wafer is once again established from the emissivity $E_{wafer\ scaled}$ determined. It is substantially applicable that the reflectivity of the wafer equals one minus the emissivity, in so far as the wafer is non-transparent for the lamp radiation.

The forecast portion of the lamp radiation in the pyrometer signal $(AC+DC)_{lamp\ reflection\ forecast}$ is supplied as a lamp forecast value to the adding unit in block 48 and added here to the forecast value of the wafer radiation. The lamp forecast value includes a constant portion and a changeable portion, whereby the changeable portion originates from a modulation of the lamp intensity, e.g. by modulation of the effective voltage applied.

As already mentioned, in block 48 the forecast value of the wafer radiation is added to the lamp forecast value so as to produce the forecast wafer pyrometer signal which is supplied to block 42. In block 42, a difference between the actually measured wafer pyrometer signal and the forecast wafer pyrometer signal is established, and a state correction (control value) Z determined from this which, once again, has an influence upon the established wafer temperature $T_{wafer}$ in block 40. Here, the system is designed in such a way that the difference converges towards zero with the continuous cycle of the upper loops. As soon as the difference is at zero or within a pre-defined tolerance interval, it can be assumed that the established wafer temperature $T_{wafer}$ corresponds to the actual wafer temperature.

In several of the aforementioned function blocks, an "established emissivity" was used as an input value. It is explained in greater detail below, with reference to FIG. 4, how the established emissivity can be determined.

As described above, in block 48 in accordance with FIG. 4, a forecast value of the wafer radiation is added to a lamp forecast value so as to obtain a forecast wafer pyrometer signal $(DC+AC)_{compl.\ forecast}$. This forecast wafer pyrometer signal, which has a changeable as well as a constant portion, is conveyed to a filter in block 90 in which the constant portion is filtered out. The signal output from block 90 thus only includes a changeable portion which substantially only originates from the modulation of the lamp radiation. This signal is call $AC_{lamp\ forecast}$. This signal is forwarded as an input value into block 92. As an additional input value, a filtered portion of the wafer pyrometer signal measured is conveyed into the block 92. For this, the wafer pyrometer signal $(DC+AC)_{compl.\ measured}$ is conveyed through a filter in block 92 so as to filter out the constant portion. The resulting signal corresponds to the measured changeable portion of the wafer pyrometer signal $AC_{measured}$ which is also conveyed as an input value into the block 92. An emissivity value for the wafer is determined in block 92 from the measured changeable portion of the wafer pyrometer signal and the forecast changeable portion of the wafer pyrometer signal. For this, an adaptive algorithm first of all adapts the optical properties of the system model (including e.g. emissivity, reflectivity and transmissivity of the wafer) so that the changeable portions (>1 Hz) of the measured wafer pyrometer signal and of the forecast wafer pyrometer signal are covered. Because this adaptation algorithm only uses and compares the changeable portions of the measured wafer pyrometer signal and the forecast pyrometer signal, the adaptation succeeds independently of the state of the real system and the system model, in particular independently of the temperature of the wafer (object). After the adaptation, the optical properties and in particular the emissivity can be taken and measured from the system model.

Provided that the wafer is turned, i.e. rotated during the thermal treatment, the wafer rotation can produce a changeable portion corresponding to the rotation speed which, once again, can be taken into consideration during the determination of the emissivity value in block 92. The changeable portion corresponding to the rotation speed can, for example, be filtered out.

The emissivity value $E_{wafer}$ established in block 92 is now forwarded to block 94 in which it is scaled for the subsequent processes, and is supplied as $E_{wafer\ scaled}$ to the subsequent determination processes.

With the above emissivity determination, substantially only the emissivity in the measurement area of the radiation detector used, such as for example the wafer pyrometer 26, is established, and this is typically 2.3 µm. With this determination it is assumed that the changeable portions of the radiation signals from the measurement and from the forecast, which primarily originate from the modulation of the radiation sources, are substantially produced by reflection on the wafer and reflection on the chamber walls. For this reason, the reflectivity of the wafer is an important factor in the adaptation, described above, of the optical properties by means of the adaptation algorithm. Of course, the transmissivity of the wafer can also assume an important role here provided that the wafer for the heat radiation is not opaque.

Figure 5:
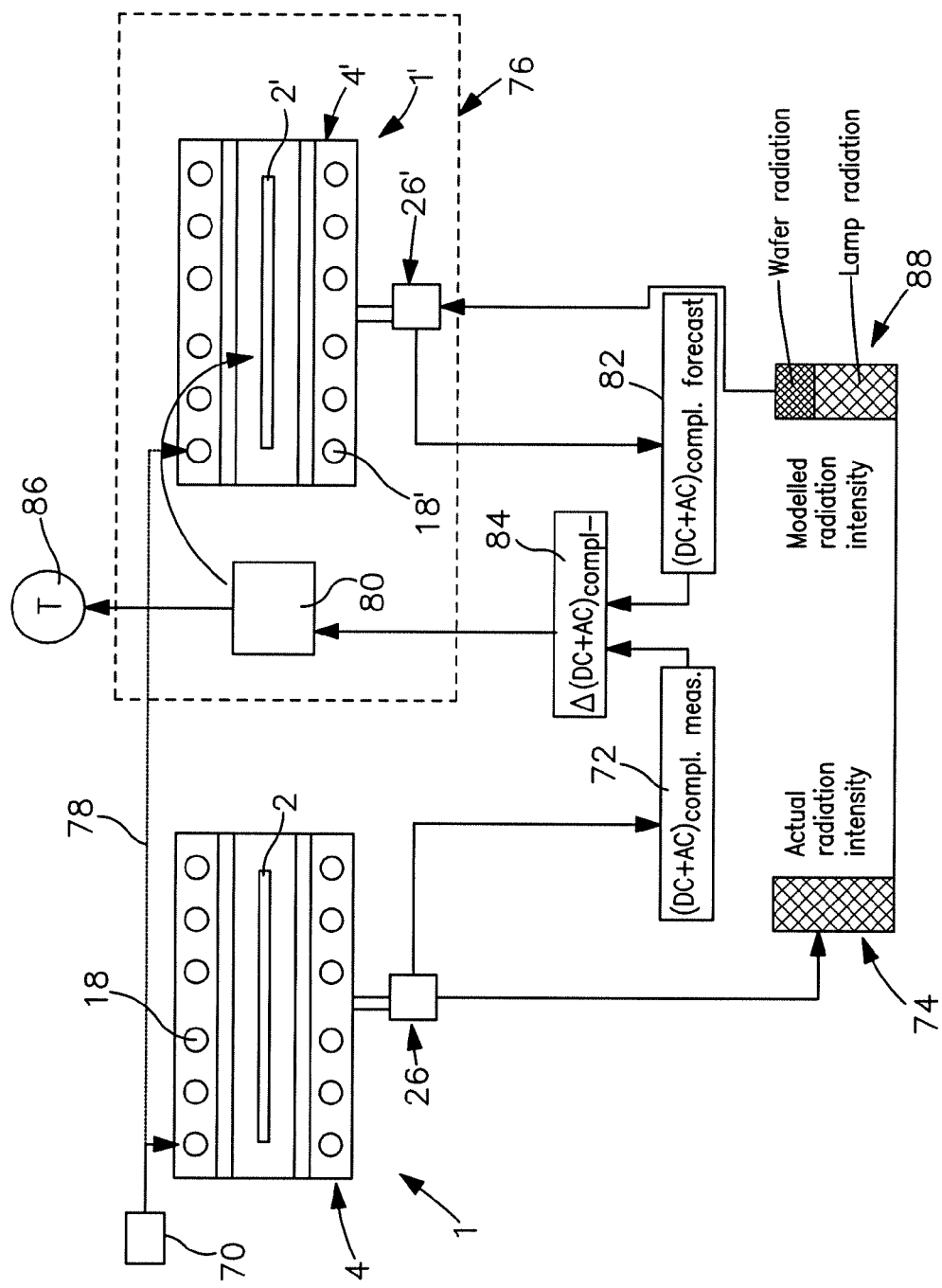
FIG. 5 shows a schematic representation of one aspect of establishing the wafer temperature in a rapid heating unit.

FIG. 5 shows a simplified representation of a system for determining the temperature of a semiconductor wafer in a rapid heating unit or for determining a state or a state variable. In FIG. 5, the same reference numbers are used as in the previous figures in so far as similar or equivalent elements are described.

Figure 6:
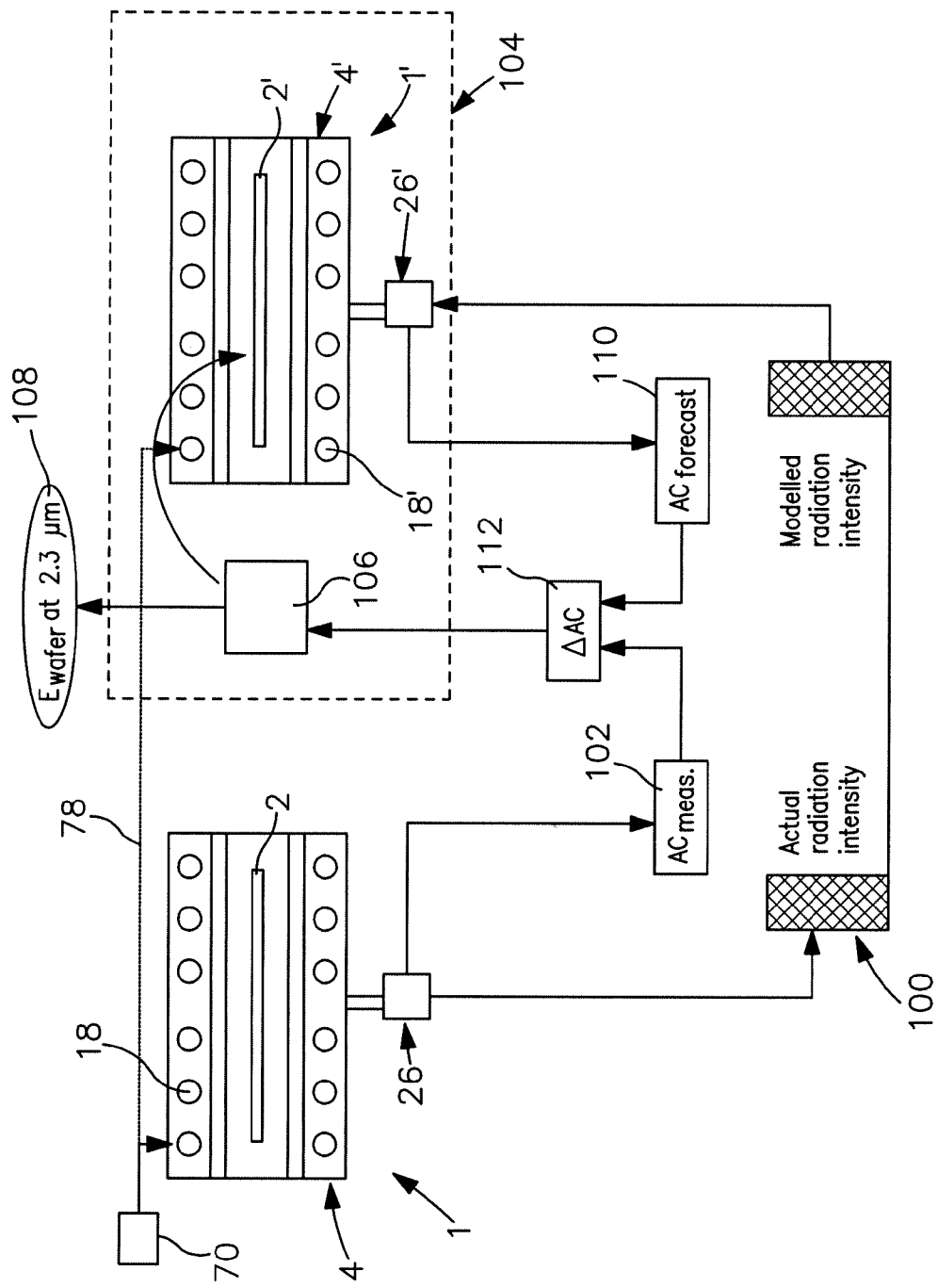
FIG. 6 shows a schematic representation of another aspect of establishing the wafer temperature in a rapid heating unit.

FIG. 6 shows a simplified representation for determining the emissivity or for determining model parameters. As described in FIG. 4, with the processes in accordance with the invention, the determination of at least one state variable (e.g. the wafer temperature) and the determination or adaptation of at least one model parameter (e.g. emissivity) run parallel, whereby the state is determined by means of an observer which is represented in simplified form in FIG. 5 by function blocks 76, 72, 82, 84 and 86. The adaptation of the model parameters is implemented using an adaptive observer which is described schematically in FIG. 6 by means of function blocks 104, 102, 112, 110 and 108.

In order to illustrate the invention presented in FIG. 4 again, in the following the state determination and the parameter adaptation by means of the observers schematically represented in FIGS. 5 and 6, are described separately from one another once again, whereby in the process in accordance with the invention shown in FIG. 4, as mentioned, the state determination and parameter adaptation run in parallel. A sequential process of the state and parameter determination would also be possible if e.g. different successive measurement values and the forecast values of the same are established, i.e. e.g. so that changeable and constant portions of a measurement signal are successively established, unlike in the embodiment in FIG. 4, and used for determining the state of parameter.

In FIG. 5, a rapid heating unit 1 with heating lamps 18 is schematically represented. A semiconductor wafer 2 is located in the rapid heating unit 1 for the thermal treatment of the same. A pyrometer 26 is directed to one side of the wafer.

The heating lamps 18 are actuated by an actuation unit 70.

During the thermal treatment of the wafer 2, radiation coming from the wafer, which includes wafer radiation as well as radiation reflected on the wafer, is measured in the pyrometer 26, and the measurement signal is forwarded to the block 72. The measurement signal is also schematically illustrated by 74.

As well as the actual rapid heating unit 1, in the box 76 defined by a broken line, a model of a rapid heating unit 1' is shown. The features of the model rapid heating unit are respectively identified with an apostrophe '. The model of the rapid heating unit 1' includes e.g. a model of the lamps 18', a model of the wafer 2', a model of the chamber 4' and a model of the pyrometer 26'. The actuation signal of the heating lamps 18 is entered in the model of the fast heating unit 1, as shown by the broken line 78. By means of the block 80, which is a part of the whole model, a temperature T of the wafer 2' is given in the model as unit 1', and said temperature has an influence upon the states of the wafer model and the states of the other models and/which has the model of the wafer 2' and the other models. Using the actuation power and the pre-specified temperature T for the wafer 2', the model of the rapid heating unit 1' calculates a forecast pyrometer signal (DC+ AC)$_{comp.\ forecast}$ and transfers this to block 82. The measured pyrometer signal from block 72 and the forecast pyrometer signal 82 are both transferred in block 84, in which a difference between these two values is calculated. From the difference, a state correction (control value) is then determined which is transferred into block 80 so as to change the temperature value T determined there (which is in the form of a state variable of a state of the model/s) of the wafer 2' in the model, taking into account the state correction. The temperature T is also issued from the model to circle 86 and can be used, for example, for a temperature regulation or temperature control outside of the model. The system shown in FIG. 5 continuously, or at pre-specified intervals of time, compares (e.g. by means of a key frequency) the measured pyrometer signal and the pyrometer signal forecast from the model, and tries to regulate the difference to zero by selecting appropriate states of the models. If the difference is zero or within a tolerance range, the modeled wafer temperature T in the circle 86 corresponds to the actual wafer temperature which can thus be established using a single wafer pyrometer 26.

The modeled radiation intensity 88 is located opposite the actual radiation intensity shown by 74, and in accordance with the model, the former can be divided into wafer radiation and lamp radiation, because the respective contributions can be identified from the model forecasts.

FIG. 6 shows an alternative representation of a system for determining the emissivity in accordance with this invention, whereby the form of the representation is similar to that of FIG. 5. For this reason, the same reference numbers are used in FIG. 6 as in FIG. 5 in so far as the same or equivalent parts are being described. FIG. 6 once again shows a schematic representation of a rapid heating unit 1 with a housing 4, as well as radiation sources 18 and a semiconductor wafer 2 held in the same. Furthermore, a pyrometer 26 is shown once again. The heating lamps 18 are once again actuated by means of an actuation unit 70.

100 represents the actually measured radiation intensity of the pyrometer 26, whereby in FIG. 6, only the changeable portion is shown. This changeable portion $AC_{measured}$ is also forwarded from the pyrometer 26 to a block 102.

In a block 104, a model of the rapid heating unit is shown once again, whereby the model elements are shown with an apostrophe'. The model of the rapid heating unit 1' comprises a model of the wafer 2', the chamber 4', the heating lamps 18' and the pyrometer 26'.

The actuating power of the actuating unit 70 is fed into this model, as indicated by the broken line 78. In the box 104 there is also a block 106 in which the emissivity of the wafer is determined at 2.3 μm, and this is entered into the model of the wafer 2' and issued to the oval (interface) 108. A changeable portion of the pyrometer signal is now forecast $AC_{forecast}$ within the model using the actuating power applied to the rapid heating unit 1. This signal is transferred to block 110, and from there to block 112. The signal $AC_{measured}$ from block 102 is also transferred into block 112. In block 112, a difference between the actually measured changeable portion of the pyrometer signal and the forecast changeable portion of the pyrometer signal is determined, and from this difference a control parameter is established which is supplied to block 106. In block 106, and using the control parameter, the emissivity is changed as a state variable of the wafer (or more accurately, as a parameter of the system model), and fed both into the model of the wafer 2' and also issued to the oval (an interface) 108. It should be noted that a change to emissivity of course also entails a change to other optical properties, such as the reflectivity and/or transmissivity in the model, although one will not go into detail here.

The system is once again designed in such a way that it tries to reduce the difference AC to zero or to a value within a pre-defined tolerance interval, so that the modeled emissivity corresponds with the actual emissivity of the wafer.

The various models used previously can be designed in different ways. With the lamp model, a calibration of the lamp model, and in particular the effect of each individual lamp upon the model, and the weighting of each lamp with regard to the forecast pyrometer signal can be determined using a calibration process. With this type of calibration process, individual lamps can respectively be operated, and the lamp radiation emitted from these can be measured. This can take place with and without a wafer in the rapid heating unit. With a wafer in the rapid heating unit, the weighting factor is established for the forecast pyrometer signal of the lamps, whereas without a wafer, the pure radiation intensity of the lamp with a specific actuation power is established.

In summary, with regard to one aspect of the invention, it is possible to develop a model which gives a good dynamic description of the process parameters in an RTP chamber. Here, a substantial uncertainty can be associated with the model in the optical parameters of a wafer located in the chamber. By using changeable portions of the heat radiation produced by module actuated heat emitters, the optical parameters of the model can be adapted to those of the real system in the aforementioned manner. Because this adaptation only takes into account the changeable portions of the radiation in the chamber, it is substantially independent of the state (e.g. the temperature) of the wafer. Following adaptation, the uncertainty of the model with regard to the optical parameters of the wafer is eliminated, and the model and the real system have almost identical transfer behavior (actuation value of the heat emitters to the measured pyrometer signal and forecast pyrometer signal). The initial state of the real system, in particular the wafer temperature, does not necessarily correspond, however, to the initial state of the system model. This difference is reflected in a difference between the measured pyrometer signal and the forecast pyrometer signal, and with the same signs and proportional for small differences. For this reason, a state correction is made using this difference. In the end effect, the model parameters are thus adjusted to the parameters of the real system, and furthermore, the state of the model also follows that of the real system within tight boundaries. For this reason, a state variable, such as for example the wafer temperature, can be taken directly from the model and measured here.

Moreover, in the previously described system, a process can be integrated whereby irregularities on one side of the semiconductor wafer, such as for example points, to which the pyrometer is directed, are identified before loading the wafer into the rapid heating unit 1. This can be achieved by scanning said surface and mapping the irregularities. For example, the individual layers of a pile can be established by a multi-point measurement. These values are entered into the temperature calculation model so that the irregularities are identified and correspondingly compensated.

In this way, the emissivity of the wafer can be calculated at any individual temperature and is available for a corresponding control device or the model.

The measurement and mapping of the rear side can be carried out at ambient temperature by means of a spectral ellipsometer in real time, while the wafer waits for its thermal treatment. Another possibility would be a surface reflection measurement and mapping of the upper side or the surface, which can also be done at ambient temperature.

This process, which can supply information for the temperature calculation model, can alternatively also be used in a conventional system for determining the temperature of a wafer.

Although the invention was previously described using a preferred embodiment given as an example, it should be noted that the invention is not limited to the specifically shown embodiments, and in particular, also comprises embodiments which result from combining and/or changing features of individual embodiments.

The specification incorporates by reference the disclosure of German priority document 102 60 673.0 filed Dec. 23, 2002, DE 103 29 107.5 filed Jun. 27, 2003, and PCT/EP2003/013387 filed Nov. 28, 2003.

The present invention is, of course, in no way restricted to the specific disclosure of the specification and drawings, but also encompasses any modifications within the scope of the appended claims.

The invention claimed is:

1. A method of determining at least one condition variable from a model of an RTP system by means of at least one measurement signal, the measurement value, detected at the RTP system and having dependency upon the condition variable that is to be determined, and by means of a measurement value, the predicted value, predicted by means of the model, wherein the measurement value and the predicted value each comprise components of a constant portion and a changeable portion, the method including the steps of separately establishing at least the changeable portion by a filter to form a first difference between the changeable portion of the measurement value and the changeable portion of the measurement value predicted by the model;

adapting at least one model parameter by feeding the first difference back into the model with the aim of adapting the model behavior to variable system parameters;

forming a second difference from the measurement value and the predicted value, or from the measurement value corrected by the changeable portion and the predicted value corrected by the changeable portion;

correcting a condition of the model system by feeding the second difference back into the model with the aim of bringing the condition of the model system into correspondence with that of the real system; and detecting at least one condition variable from the model.

2. A method according to claim 1, wherein the feeding of the first difference back takes place by means of a first valuation function and a first control algorithm and/or the feeding of the second difference back takes place by means of a second valuation function and a second control algorithm.

3. A method according to claim 1, wherein the RTP system is a rapid heating unit with which a semiconductor wafer, is heated with radiation sources, and/or the model includes at least one semiconductor wafer heated in the RTP system and forms a system model.

4. A method according to claim 3, wherein in order to modulate radiation sources by means of an actuation value, different radiation sources are actuated with different modulation parameters to clearly adapt transmissivity and/or reflectivity parameters, of a semiconductor wafer.

5. A method according to claim 4, wherein modulation is produced and represented by a continuous, though not necessarily periodic, stimulus by means of pseudo random sequences, colored noises, or by stimuli of a set value of the radiation sources caused parasitically in the system by interference.

6. A method according to claim 1, wherein the condition variable comprises at least a temperature of a semiconductor wafer.

7. A method according to claim 1, wherein the system model takes into account the optical properties of a wafer by means of model parameters, and wherein optical properties of the wafer in the system model are adjusted to the real optical properties of the wafer in a rapid heating unit.

8. A method according to claim 5, wherein the measurement value has a changeable portion that depends substantially upon optical properties of a wafer and is produced by a modulation of the radiation sources, and wherein adjustment of the optical properties takes place by means of an algorithm that adjusts the changeable portion in the detected measurement value and that of the predicted measurement by adaptation of optical properties of the wafer in the system model.

9. A method according to claim 8, wherein the optical properties of the wafer comprise the emissivity and/or the reflectivity and/or the transmissivity.

10. A method according to claim 3, wherein the measurement value comprises at least radiation that is coming from a semiconductor wafer and that is collected by a pyrometer.

11. A method according to claim 10, wherein the collected radiation comprises at least heat radiation from the semiconductor wafer and radiation from the radiation sources reflected at the semiconductor wafer.

12. A method according to claim 1, wherein determination of the predicted value of the measurement value comprises determination of a predicted value of a semiconductor wafer radiation which predicts a portion of a pyrometer signal caused by the wafer.

13. A method according to claim 12, wherein the determination of the predicted value of the wafer radiation comprises determination of an intensity value of a semiconductor wafer radiation in the area of a measurement wavelength of the pyrometer using the established condition variable and an established emissivity of the semiconductor wafer.

14. A method according to claim 13, wherein the determination of the predicted value of the wafer radiation is effected using a model, taking into account the intensity value of the wafer radiation in the area of the measurement wavelength of the pyrometer and an established emissivity of the semiconductor wafer.

15. A method according to claim 14, wherein the model takes into account an influence of a rapid heating unit chamber upon the established emissivity of the semiconductor wafer.

16. A method according to claim 12, wherein the determination of the predicted value of the measurement value comprises determination of a lamp predicted value which predicts a portion of a pyrometer signal caused by radiation sources.

17. A method according to claim 16, wherein the determination of the lamp predicted value comprises the determination of a broadband intensity value of the heat radiation of the semiconductor wafer using the established condition variable and an established emissivity of a semiconductor wafer.

18. A method according to claim 16, wherein the determination of the lamp predicted value comprises the determination of an intensity value of the radiation sources using a lamp model and the actuation value of the radiation sources.

19. A method according to claim 18, wherein the lamp model takes into account interactions between the semiconductor wafer and the individual radiation sources.

20. A method according to claim 19, wherein the lamp model uses a predicted broadband intensity value of the heat radiation of the semiconductor wafer as an input value.

21. A method according to claim 18, wherein the lamp model takes into account interactions between the individual radiation sources.

22. A method according to claim 18, wherein the radiation sources are combined as groups and an intensity value for the radiation sources is determined for the respective groups.

23. A method according to claim 22, wherein the determination of the intensity value for the radiation sources for the respective groups is effected using at least two representatives of the group.

24. A method according to claim 22, wherein the radiation sources are actuated at least within one group with the same value.

25. A method according to claim 16, wherein when determining the lamp predicted value, a model is used that predicts the portion of the lamp radiation that is reflected at the semiconductor wafer and that falls in the visual field of the pyrometer, and wherein this is accomplished using a determined intensity value of the radiation sources and an established emissivity of the semiconductor wafer.

26. A method according to claim 25, wherein the model establishes the reflectivity of the semiconductor wafer.

27. A method according to claim 26, wherein the reflectivity is established using the established emissivity.

28. A method according to claim 25, wherein the model takes into account the chamber geometry of a rapid heating unit.

29. A method according to claim 16, wherein the predicted value of the measurement value is formed by adding the predicted value of the wafer radiation and the lamp predicted value.

30. A method according to claim 29, wherein the predicted value of the wafer radiation essentially includes a constant portion of the predicted value of the measurement value, and wherein the lamp predicted value essentially includes a constant portion and a changeable portion of the predicted value of the measurement value.

31. A method according to claim 12, wherein the emissivity of the semiconductor wafer is established at least partially from the predicted value of the measurement value.

32. A method according to claim 31, wherein the predicted value of the measurement value is filtered to establish the changeable portion thereof that essentially corresponds to the modulated portion of the radiation originating from radiation sources and reflected at the semiconductor wafer, which radiation falls in the pyrometer from a measurement point on the semiconductor wafer.

33. A method according to claim 32, wherein the emissivity of the semiconductor wafer is established using an adaptive algorithm that compares the changeable portion of the predicted value of the measurement value and a changeable portion recorded by the pyrometer and originating from the radiation of at least one measurement point on the semiconductor wafer.

34. A method according to claim 3, wherein a semiconductor wafer is rotated in the rapid heating unit, and a rotation speed and/or a rotation phase in the model is taken into account for establishing the emissivity and/or optical fluctuations of the wafer and/or of a wafer carrier of the semiconductor wafer.

35. A method according to claim 34, wherein an established emissivity is scaled before it is taken on to other processes.

36. A method according to claim 3, wherein a semiconductor wafer in the model for establishing a condition variable is seen as a black body.

37. A method according to claim 1, wherein the RTP system comprises at least one heating device that is modulated with regard to the heat energy it gives out, and wherein the measurement value is established on an object that, due to its thermal properties and/or its thermal coupling to the modulated heating device, only immaterially follows the modulation of the heating device with regard to its temperature.

38. A method according to claim 37, wherein the object is a semiconductor wafer, a cladding that at least partially surrounds at least one semiconductor wafer, a chamber wall of a process chamber of the RTP system, or a item in the vicinity of a semiconductor wafer.

39. A method according to claim 1, wherein the measurement value is established by means of a pyrometer and/or a thermocouple element.

40. A method according to claim 39, wherein the condition variable is the temperature of the object.

41. A method according to claim 40, wherein the condition variable is the temperature of a semiconductor wafer, and wherein the measurement value is established on the semiconductor wafer and/or on an item in the vicinity of the semiconductor wafer.

42. A method according to claim 1, wherein the model parameters comprise reflectivity, transmissivity and/or emissivity properties of the semiconductor wafer.

* * * * *